(12) United States Patent
Kojima et al.

(10) Patent No.: US 8,288,843 B2
(45) Date of Patent: Oct. 16, 2012

(54) SEMICONDUCTOR LIGHT-EMITTING DEVICE AND METHOD FOR MANUFACTURING SAME

(75) Inventors: Akihiro Kojima, Kanagawa-ken (JP);
Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 12/728,846

(22) Filed: Mar. 22, 2010

(65) Prior Publication Data
US 2011/0114978 A1    May 19, 2011

(30) Foreign Application Priority Data
Nov. 19, 2009    (JP) ................... 2009-263638

(51) Int. Cl.
*H01L 23/544* (2006.01)
(52) U.S. Cl. ........ 257/620; 257/622; 257/623; 257/625; 257/626; 257/666; 257/678; 257/797; 257/E21.523
(58) Field of Classification Search .................. None
See application file for complete search history.

(56) References Cited

U.S. PATENT DOCUMENTS

| | | | |
|---|---|---|---|
| 6,331,450 B1 | 12/2001 | Uemura | |
| 7,012,279 B2 * | 3/2006 | Wierer Jr. et al. | 257/94 |
| 2004/0036080 A1 * | 2/2004 | Bogner et al. | 257/98 |
| 2004/0188696 A1 | 9/2004 | Hsing Chen et al. | |
| 2005/0073840 A1 * | 4/2005 | Chou et al. | 362/238 |
| 2006/0097274 A1 * | 5/2006 | Lee et al. | 257/98 |
| 2007/0152230 A1 * | 7/2007 | Duong et al. | 257/98 |
| 2008/0252212 A1 * | 10/2008 | Suehiro et al. | 313/512 |
| 2009/0014736 A1 | 1/2009 | Ibbetson et al. | |
| 2010/0140640 A1 | 6/2010 | Shimokawa et al. | |
| 2010/0148198 A1 | 6/2010 | Sugizaki et al. | |
| 2011/0073889 A1 | 3/2011 | Sugizaki et al. | |
| 2011/0114986 A1 | 5/2011 | Kojima et al. | |

FOREIGN PATENT DOCUMENTS

| | | |
|---|---|---|
| EP | 1020935 A2 | 7/2000 |
| EP | 1198016 A2 | 4/2002 |
| JP | 10-163536 | 6/1998 |
| JP | 2000-244012 | 9/2000 |
| JP | 2005-116998 | 4/2005 |

OTHER PUBLICATIONS

Extended European Search Report for Application No. 10157158.6-1226 dated Apr. 28, 2011.

* cited by examiner

*Primary Examiner* — Fei Fei Yeung Lopez
(74) *Attorney, Agent, or Firm* — Turocy & Watson, LLP

(57) ABSTRACT

A semiconductor light-emitting device includes: a first semiconductor layer having a first major surface, a second major surface which is an opposite side from the first major surface, and a side surface; a second semiconductor layer provided on the second major surface of the first semiconductor layer and including a light-emitting layer; electrodes provided on the second major surface of the first semiconductor layer and on a surface of the second semiconductor layer on an opposite side from the first semiconductor layer; an insulating layer having a first surface formed on the second major surface side of the first semiconductor layer and a second surface which is an opposite side from the first surface; an external terminal which is a conductor provided on the second surface side of the insulating layer; and a phosphor layer provided on the first major surface of the first semiconductor layer and on a portion of the first surface of the insulating layer, the portion being adjacent to the side surface of the first semiconductor layer.

20 Claims, 8 Drawing Sheets

SEMICONDUCTOR LIGHT-EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2009-263638, filed on Nov. 19, 2009; the entire contents of which are incorporated herein by reference.

BACKGROUND

A wavelength-converting light-emitting diode is conventionally known, in which a blue light-emitting element is combined with a phosphor layer to produce white light. JP-A-2005-116998, for instance, discloses a manufacturing technique in which a phosphor layer is formed on the upper surface of a wafer including numerous LEDs, and then the wafer is cut into chip-size pieces. Thus, in this technique, the phosphor layer is formed only on the upper surface of the light-emitting diode.

SUMMARY

According to an aspect of the invention, there is provided a semiconductor light-emitting device including: a first semiconductor layer having a first major surface, a second major surface which is an opposite side from the first major surface, and a side surface; a second semiconductor layer provided on the second major surface of the first semiconductor layer and including a light-emitting layer; electrodes provided on the second major surface of the first semiconductor layer and on a surface of the second semiconductor layer on an opposite side from the first semiconductor layer; an insulating layer having a first surface formed on the second major surface side of the first semiconductor layer and a second surface which is an opposite side from the first surface; an external terminal which is a conductor provided on the second surface side of the insulating layer; and a phosphor layer provided on the first major surface of the first semiconductor layer and on a portion of the first surface of the insulating layer, the portion being adjacent to the side surface of the first semiconductor layer.

According to another aspect of the invention, there is provided a semiconductor light-emitting device including: a first semiconductor layer having a first major surface, a second major surface which is an opposite side from the first major surface, and a side surface; a second semiconductor layer provided on the second major surface of the first semiconductor layer and including a light-emitting layer; electrodes provided on the second major surface of the first semiconductor layer and on a surface of the second semiconductor layer on an opposite side from the first semiconductor layer; and a phosphor layer provided on the first major surface of the first semiconductor layer and on a portion in a groove formed through the first semiconductor layer, the portion being adjacent to the side surface of the first semiconductor layer.

According to still another aspect of the invention, there is provided a method for manufacturing a semiconductor light-emitting device, including: forming a multilayer body including a first semiconductor layer having a first major surface and a second major surface which is an opposite side from the first major surface, a second semiconductor layer including a light-emitting layer laminated on the second major surface of the first semiconductor layer, and electrodes formed on the second major surface of the first semiconductor layer and on a surface of the second semiconductor layer on an opposite side from the first semiconductor layer; forming a groove through the first semiconductor layer; and forming a phosphor layer on the first major surface and on a side surface of the first semiconductor layer in the groove.

DETAILED DESCRIPTION

Embodiments of the invention will be described with reference to the drawings.

Figure 1A:
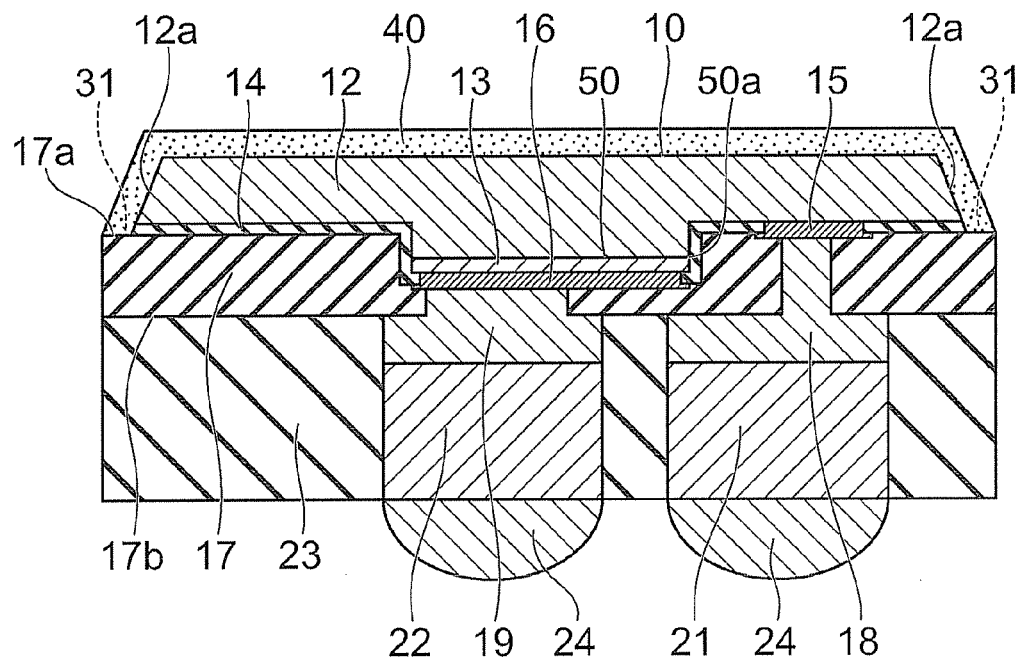
FIG. 1A is a schematic cross-sectional view of a semiconductor light-emitting device according to an embodiment.

FIG. 1A is a schematic cross-sectional view of a semiconductor light-emitting device according to an embodiment.

The semiconductor light-emitting device according to this embodiment includes a semiconductor structure section, a package structure section including an interconnect layer, and a phosphor layer, which are collectively formed in a wafer state. The semiconductor structure section includes a first semiconductor layer 12 and a second semiconductor layer 13. The second semiconductor layer 13 has a structure in which a light-emitting layer (or active layer) is sandwiched between a p-type cladding layer and an n-type cladding layer. The first semiconductor layer 12 is illustratively of n-type and functions as a lateral current path. However, the conductivity type of the first semiconductor layer 12 is not limited to n-type, but may be p-type.

The first major surface of the first semiconductor layer 12 is a top surface 10, and light is extracted outside mainly from the top surface 10. The second semiconductor layer 13 is provided on the second major surface opposite to the top surface 10. Part of the second major surface side of the first semiconductor layer 12 is processed into a protruding shape, and the second semiconductor layer 13 is provided on the surface of that protrusion. The second semiconductor layer 13 is smaller in planar size than the first semiconductor layer 12.

An n-side electrode 15 is provided on the portion of the second major surface of the first semiconductor layer 12 where the second semiconductor layer 13 is not provided. A p-side electrode 16 is provided on the surface of the second semiconductor layer 13 opposite to its surface in contact with the first semiconductor layer 12.

The portion of the second major surface and the second semiconductor layer 13 other than the portion where the n-side electrode 15 and the p-side electrode 16 are provided is covered with an insulating film 14. Furthermore, an insulating layer 17 is provided on the second major surface side of the first semiconductor layer 12 so as to cover the insulating film 14, the n-side electrode 15, and the p-side electrode 16. For instance, the insulating film 14 is made of silicon oxide, and the insulating layer 17 is made of silicon oxide or a resin such as polyimide. The n-side electrode 15 and the p-side electrode 16 are insulated from each other by the insulating film 14 and the insulating layer 17 and serve as electrically independent electrodes.

The insulating layer 17 has a first surface 17a which is located on the side of the second major surface of the first semiconductor layer 12, the n-side electrode 15, and the p-side electrode 16, and a second surface 17b located on the opposite side from the first surface 17a. The second surface 17b is planarized, and an n-side interconnect 18 and a p-side interconnect 19 are provided on the second surface 17b. The n-side interconnect 18 is provided also in an opening which is formed in the insulating layer 17 so as to reach the n-side electrode 15, and the n-side interconnect 18 is electrically connected to the n-side electrode 15. The p-side interconnect 19 is provided also in an opening which is formed in the insulating layer 17 so as to reach the p-side electrode 16, and the p-side interconnect 19 is electrically connected to the p-side electrode 16. For instance, the n-side interconnect 18 and the p-side interconnect 19 are formed by electrolytic plating in which a seed metal formed on the inner wall surface of the opening and the second surface 17b of the insulating layer 17 is used as a current path.

The n-side electrode 15, the p-side electrode 16, the n-side interconnect 18, the p-side interconnect 19, the insulating film 14, and the insulating layer 17 are all provided on the opposite side of the semiconductor structure section from the top surface 10 and constitute the interconnect layer.

An n-side metal pillar 21 is provided below the n-side interconnect 18. A p-side metal pillar 22 is provided below the p-side interconnect 19. The second surface 17b of the insulating layer 17, the periphery of the n-side metal pillar 21, the periphery of the p-side metal pillar 22, the n-side interconnect 18, and the p-side interconnect 19 are covered with a resin 23.

The first semiconductor layer 12 is electrically connected to the n-side metal pillar 21 through the n-side electrode 15 and the n-side interconnect 18. The second semiconductor layer 13 is electrically connected to the p-side metal pillar 22 through the p-side electrode 16 and the p-side interconnect 19. External terminals 24 such as solder balls and metal bumps are provided on the lower end surface (the end surface on the opposite side from the junction with the n-side interconnect 18 and the p-side interconnect 19) of the n-side metal pillar 21 and the p-side metal pillar 22 exposed from the resin 23, and the semiconductor light-emitting device according to this embodiment can be electrically connected to external circuits through the external terminals 24.

In the structure of this embodiment, even if the semiconductor structure section (the multilayer body of the first semiconductor layer 12 and the second semiconductor layer 13) is thin, its mechanical strength can be maintained by thickening the n-side metal pillar 21, the p-side metal pillar 22, and the resin 23. Furthermore, the n-side metal pillar 21 and the p-side metal pillar 22 can absorb and relax the stress applied to the semiconductor layer through the external terminals 24 when the device is mounted on a circuit board or the like. Preferably, the resin 23 serving to support the n-side metal pillar 21 and the p-side metal pillar 22 has a thermal expansion coefficient which is equal or close to that of the circuit board and the like. Examples of the resin 23 include epoxy resin, silicone resin, and fluororesin.

The n-side interconnect 18, the p-side interconnect 19, the n-side metal pillar 21, and the p-side metal pillar 22 can be made of such a material as copper, gold, nickel, and silver. Among them, it is more preferable to use copper, which has good thermal conductivity, high migration resistance, and superior contact with the insulating film.

The first semiconductor layer 12, the second semiconductor layer 13, the insulating layer 17, the resin 23 and the like are collectively formed in a wafer state. In the wafer state, as described later, a groove reaching the first surface 17a of the insulating layer 17 through the first semiconductor layer 12 is formed in the first semiconductor layer 12. The semiconductor light-emitting device shown in FIG. 1A is a singulated one diced at the position of the groove. As a result of singulation by dicing at the position of the groove in the wafer state, a step portion 31 is formed between the first surface 17a of the insulating layer 17 and the top surface 10, which is the first major surface of the first semiconductor layer 12.

The light-emitting layer is provided near an interface 50 between the first semiconductor layer 12 and the second semiconductor layer 13, and emits light by supply of current to the first semiconductor layer 12 and the second semiconductor layer 13 through the aforementioned metal pillars, interconnects, and electrodes. The light emitted from the light-emitting layer travels in the first semiconductor layer 12, and is emitted outside from the top surface 10 and the side surface 12a of the first semiconductor layer 12. The side surface 12a results from the formation of the groove in the first semiconductor layer 12.

A phosphor layer 40 is opposed to the top surface 10 and the side surface 12a. The phosphor layer 40 covers the top surface 10 and the side surface 12a. The phosphor layer 40 covering the top surface 10 and the phosphor layer 40 covering the side surface 12a are continuously and integrally provided, and the phosphor layer 40 continuously covers the step portion 31 between the first surface 17a of the insulating layer 17 and the top surface 10. The phosphor layer 40 covers the top surface 10 and the side surface 12a with a generally uniform thickness.

The phosphor layer 40 can absorb the light from the light-emitting layer and emit wavelength-converted light. Thus, it is possible to emit mixed light of the light from the light-emitting layer and the wavelength-converted light of the phosphor layer 40. For instance, for a nitride light-emitting layer, a white color, incandescent color and the like can be obtained as a mixed color of blue light from the light-emitting layer and yellow light, for instance, which is the wavelength-converted light of a yellow phosphor layer 40.

Figure 1B:
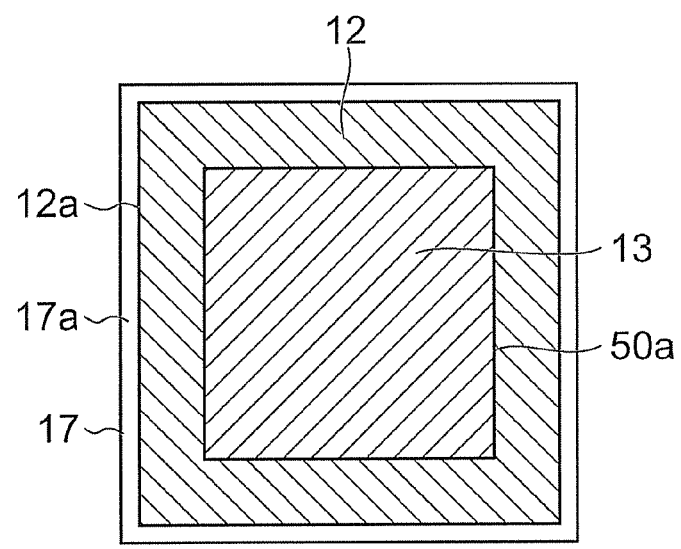
FIG. 1B is a schematic view illustrating a planar layout of a major component of the semiconductor light-emitting device.

FIG. 1B shows a planar layout of the first semiconductor layer 12, the second semiconductor layer 13, and the insulating layer 17.

The first semiconductor layer 12 is larger in planar size than the second semiconductor layer 13, and the side surface 12a of the first semiconductor layer 12 is located outside the edge of the second semiconductor layer 13. The insulating layer 17 is larger in planar size than the first semiconductor layer 12, and a portion of the first surface 17a of the insulating layer 17 is located outside the side surface 12a. The phosphor layer 40 provided on and above that portion of the first surface 17a of the insulating layer 17 and being adjacent to the side surface 12a continuously surrounds, like a frame, the periphery of the side surface 12a of the first semiconductor layer 12.

In the semiconductor light-emitting device according to this embodiment, the first semiconductor layer 12 is covered with the phosphor layer 40 not only on the top surface 10 but also on the side surface 12a. Hence, light emitted from the side surface 12a can also pass through the phosphor layer 40. Because the phosphor layer 40 covering the top surface 10 has generally the same thickness as the phosphor layer 40 covering the side surface 12a, the distance in the phosphor layer 40 traversed by the light emitted from the top surface 10 is generally equal to the distance in the phosphor layer 40 traversed by the light emitted from the side surface 12a. This prevents variation in chromaticity, and light with a desired chromaticity can be extracted outside.

The edge 50a of the interface 50 between the first semiconductor layer 12 and the second semiconductor layer 13 is located inside the side surface 12a. The distance between the edge 50a of the interface 50 and the side surface 12a is generally uniform in all directions, or throughout the circumference, in plan view. Thus, light with generally uniform brightness and chromaticity can be extracted from any side surface 12a.

Furthermore, the insulating layer 17 and the resin 23 are larger in planar size than the first semiconductor layer 12, and the edge of the insulating layer 17 and the resin 23 protrude outside from the side surface 12a of the first semiconductor layer 12. The first semiconductor layer 12 is provided in a mesa or trapezoidal shape on the first surface 17a of the insulating layer 17. The phosphor layer 40 covering the side surface 12a at the step portion 31 is located on the first surface 17a of the insulating layer 17 above the external terminals 24, and does not cover the side surface of the insulating layer 17 and the resin 23. Furthermore, the phosphor layer 40 does not cover the external terminals 24, either. Thus, the phosphor layer 40 is not formed uselessly on the portion making no contribution to emission of light, which serves for cost reduction. For instance, as a comparative example, the chip may be covered with a phosphor layer after flip-chip mounting. However, in this case, it is difficult to form the phosphor layer so as to cover only the portion of the semiconductor layer, but the interconnect layer, the package structure, the external terminals and the like below the chip are also covered uselessly with the phosphor layer.

Next, a method for manufacturing a semiconductor light-emitting device according to this embodiment is described with reference to FIGS. 2 to 5.

Figure 2A:
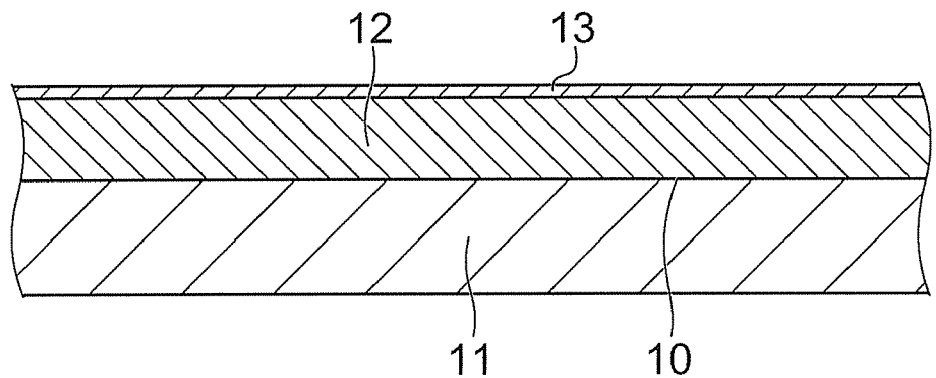
FIGS. 2A to 5B are cross-sectional views illustrating a method for manufacturing a semiconductor light-emitting device.

First, as shown in FIG. 2A, a first semiconductor layer 12 is formed on the major surface of a substrate 11, and a second semiconductor layer 13 is formed thereon. The surface of the first semiconductor layer 12 in contact with the major surface of the substrate 11 which is the top surface 10. For instance, in the case where the light-emitting layer is made of a nitride semiconductor, the first semiconductor layer 12 and the second semiconductor layer 13 can be crystal grown on a sapphire substrate.

Figure 2B:
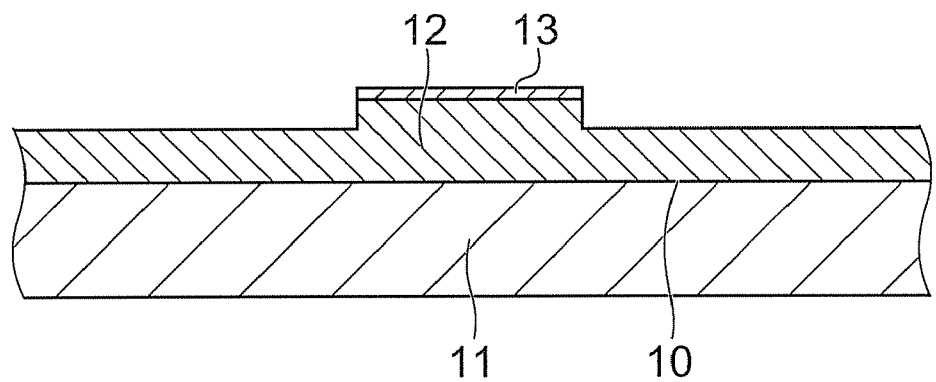

Next, by using a mask (not shown) the first semiconductor layer 12 and the second semiconductor layer 13 are processed. As shown in FIG. 2B, part of the first semiconductor layer 12 is processed into a protruding shape, and the second semiconductor layer 13 is selectively left on the surface of that protrusion.

Figure 2C:
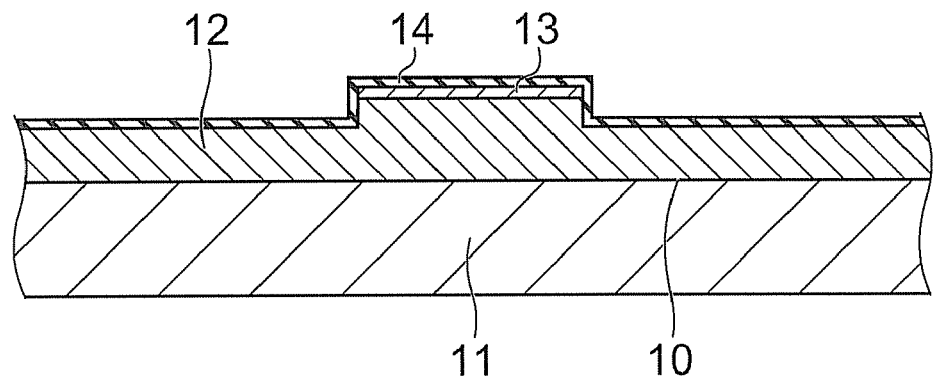

Next, as shown in FIG. 2C, an insulating film 14 entirely covering the first semiconductor layer 12 and the second semiconductor layer 13 is formed. The insulating film 14 is illustratively a silicon oxide film.

Figure 3A:
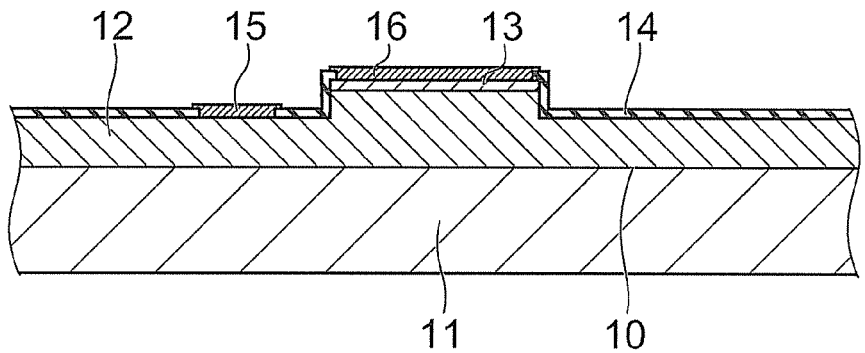

Next, as shown in FIG. 3A, openings are selectively formed in the insulating film 14. Then, an n-side electrode 15 is formed on the first semiconductor layer 12 exposed to the opening. Likewise, a p-side electrode 16 is formed on the second semiconductor layer 13 exposed to the opening of the insulating film 14.

Figure 3B:
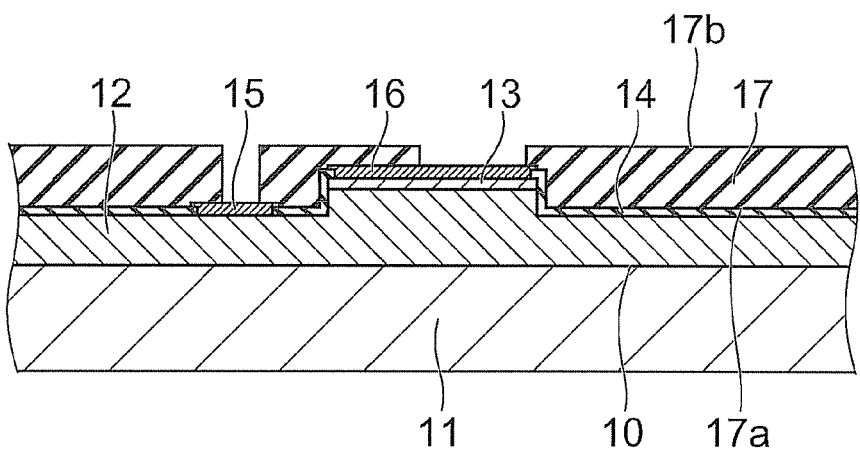

Next, an insulating layer 17 covering the n-side electrode 15, the p-side electrode 16, and the insulating film 14 is formed. Then, as shown in FIG. 3B, an opening reaching the n-side electrode 15 and an opening reaching the p-side electrode 16 are formed in the insulating layer 17.

Next, a seed metal is formed on the second surface 17b and the inner wall of the opening of the insulating layer 17, and a plating resist, not shown, is further formed. Then, electrolytic plating is performed using the seed metal as a current path.

Figure 3C:
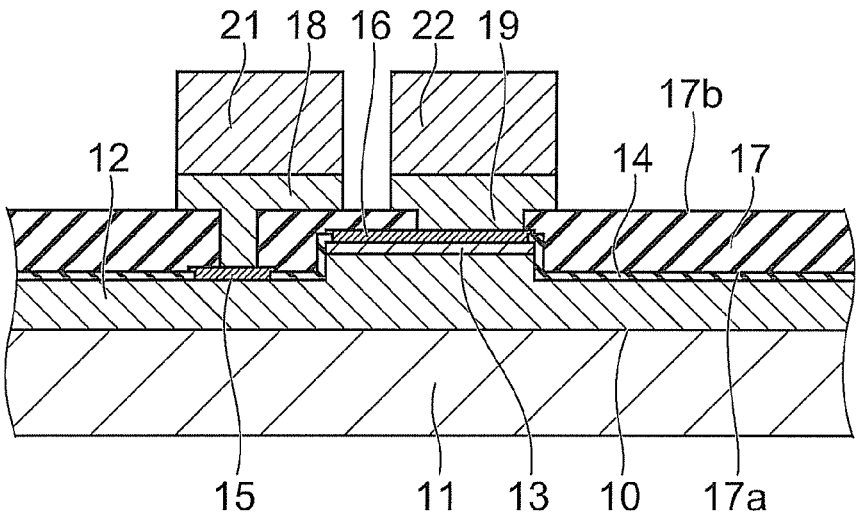

Thus, as shown in FIG. 3C, an n-side interconnect 18 connected to the n-side electrode 15 and a p-side interconnect 19 connected to the p-side electrode 16 are formed in the openings of the insulating layer 17 and on the insulating layer 17 therearound.

Next, the plating resist used in the plating for forming the n-side interconnect 18 and the p-side interconnect 19 is removed. Then, another plating resist for forming metal pillars is formed, and electrolytic plating is performed using the aforementioned seed metal as a current path. Thus, as shown in FIG. 3C, an n-side metal pillar 21 is formed on the n-side interconnect 18, and a p-side metal pillar 22 is formed on the p-side interconnect 19.

Subsequently, the plating resist is removed, and furthermore the exposed portion of the seed metal is removed. This breaks the electrical connection between the n-side interconnect 18 and the p-side interconnect 19 through the seed metal.

Figure 4A:
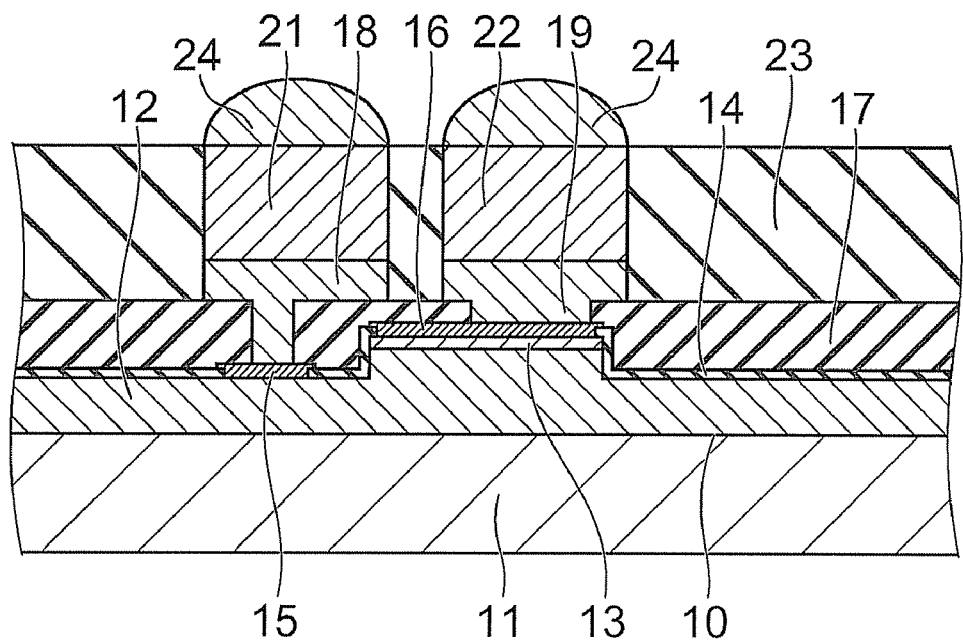

Next, as shown in FIG. 4A, the n-side interconnect 18, the p-side interconnect 19, the n-side metal pillar 21, the p-side metal pillar 22, and the insulating layer 17 are covered with a resin 23. Subsequently, the surface of the resin 23 is ground to expose the upper surface of the n-side metal pillar 21 and the p-side metal pillar 22. Then, external terminals 24 such as solder balls and metal bumps are provided on the exposed surface.

Figure 4B:
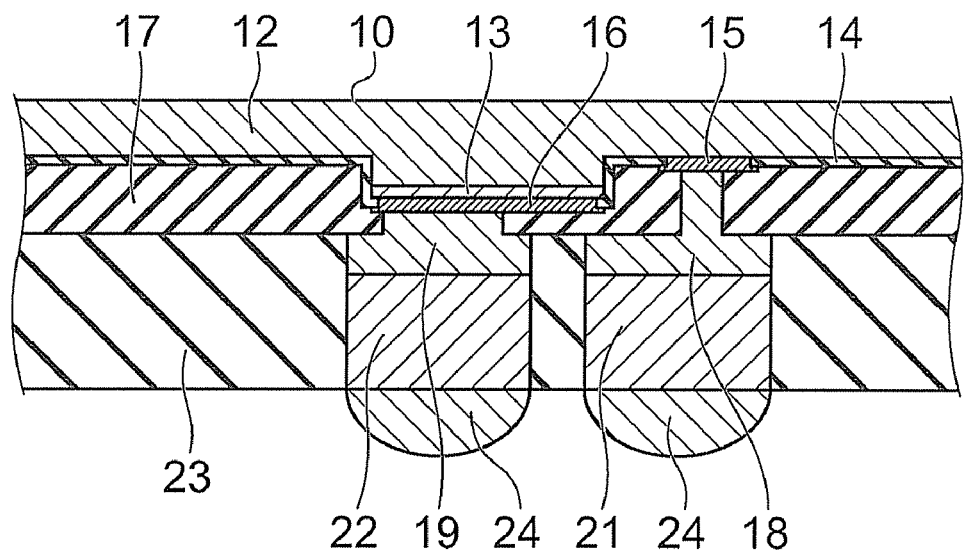

Next, as shown in FIG. 4B, the substrate 11 is removed. Here, FIG. 4B is depicted with the positional relationship turned upside down with respect to FIG. 4A.

The substrate 11 is removed from the first semiconductor layer 12 illustratively by laser lift-off. More specifically, laser light is applied toward the first semiconductor layer 12 from the rear surface side of the substrate 11, which is opposite to its major surface on which the first semiconductor layer 12 is formed. The laser light has a wavelength to which the substrate 11 is transmissive and which falls in an absorption region of the first semiconductor layer 12.

When the laser light reaches the interface between the substrate 11 and the first semiconductor layer 12, the first semiconductor layer 12 near the interface is decomposed by absorbing the energy of the laser light. For instance, in the case where the first semiconductor layer 12 is made of GaN, it is decomposed into Ga and nitrogen gas. Ga is left on the first semiconductor layer 12 side. This decomposition reaction forms a small gap between the substrate 11 and the first semiconductor layer 12, thereby separating the substrate 11 from the first semiconductor layer 12. Irradiation with the laser light is performed in a plurality of times on predefined regions across the wafer to strip the substrate 11.

Figure 5A:
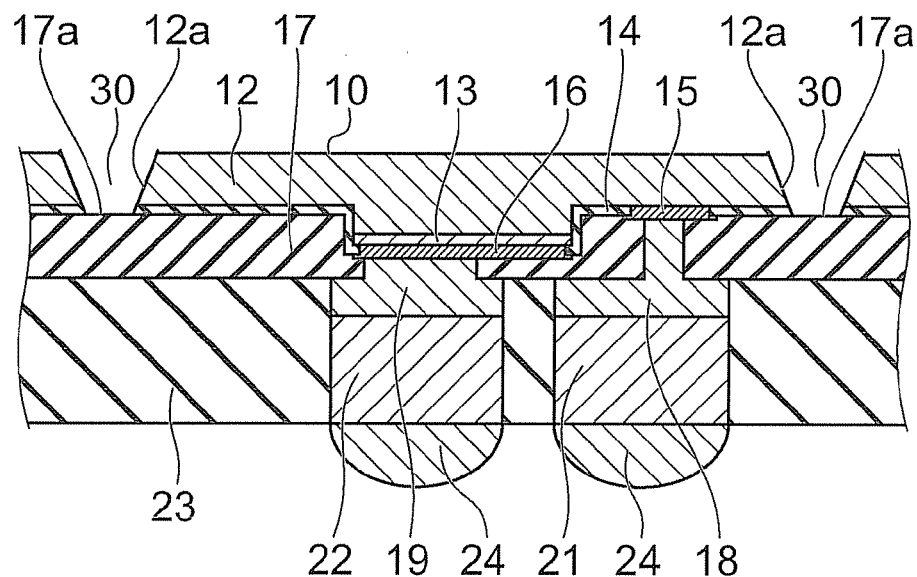
Figure 8A:
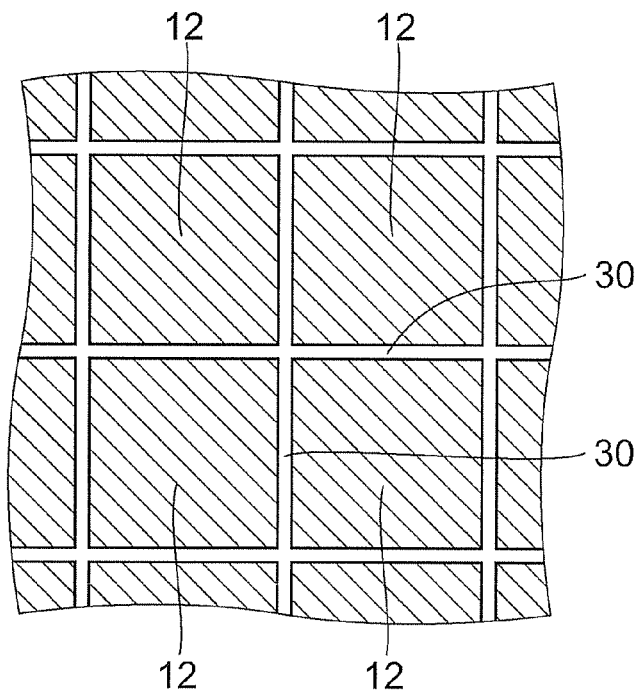
FIGS. 8A and 8B are schematic views of the relevant part of the semiconductor light-emitting device in the wafer state according to this embodiment.

After the substrate 11 is removed, a groove 30 is formed in the first semiconductor layer 12 as shown in FIG. 5A. The groove 30 reaches the first surface 17a of the insulating layer 17 through the first semiconductor layer 12 and the insulating film 14. The groove 30 can illustratively be formed by RIE (reactive ion etching) using a mask. In this case, the cross section of the groove 30 tends to be shaped like an inverted truncated cone, and hence the side surface 12a exposed into the groove 30 is formed as a sloped surface. As shown in FIG. 8A, the groove 30 is illustratively formed like a lattice on the wafer.

Alternatively, the groove 30 may be formed using laser processing, a diamond blade and the like. Depending on the method and condition for forming the groove 30, the side surface 12a, which is the inner wall surface of the groove 30, may not be a sloped surface, but a surface generally perpendicular to the top surface 10.

Figure 5B:
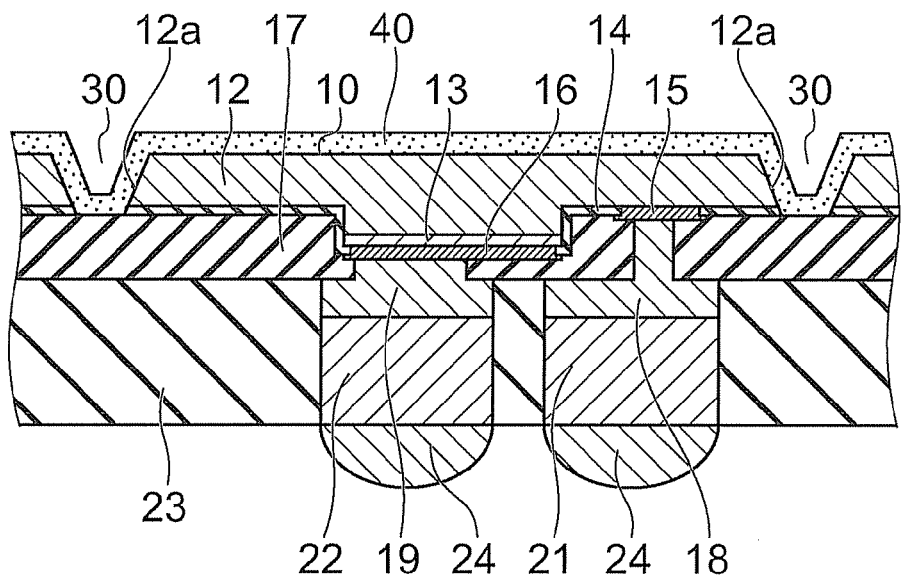

Next, as shown in FIG. 5B, a phosphor layer 40 is formed on the first semiconductor layer 12 and the inner wall of the groove 30. The phosphor layer 40 continuously and integrally covers the top surface 10 and the side surface 12a.

For instance, the phosphor layer 40 is formed by applying a liquid resin mixed with phosphor particles by spin-coating, and then heat-curing it. This method has a good controllability with which the thickness of the phosphor layer 40 is kept generally uniform between the portion covering the top surface 10 and the portion covering the side surface 12a.

Because the phosphor layer 40 is formed after the substrate 11 is removed from above the top surface 10, the substrate 11 does not exist between the top surface 10 and the phosphor layer 40, which serves to increase the light extraction efficiency.

Subsequently, by dicing at the position of the groove 30, a singulated semiconductor light-emitting device is obtained as shown in FIG. 1A. The means for dicing can illustratively be machine cutting using a diamond blade or the like, laser irradiation, or high-pressure water. Here, because the substrate 11 and the semiconductor layers 12, 13 do not exist at the dicing position, or the groove 30, dicing can be easily performed, and the productivity can be improved.

The aforementioned steps up to dicing are each performed collectively in the wafer state, which enables production at low cost. Furthermore, the package structure including the interconnect layer, the resin 23, and the metal pillars 21, 22 is formed in the wafer level. This facilitates downsizing in which the overall planar size of the semiconductor light-emitting device is close to the planar size of the bare chip (first semiconductor layer 12 and second semiconductor layer 13).

Figure 6A:
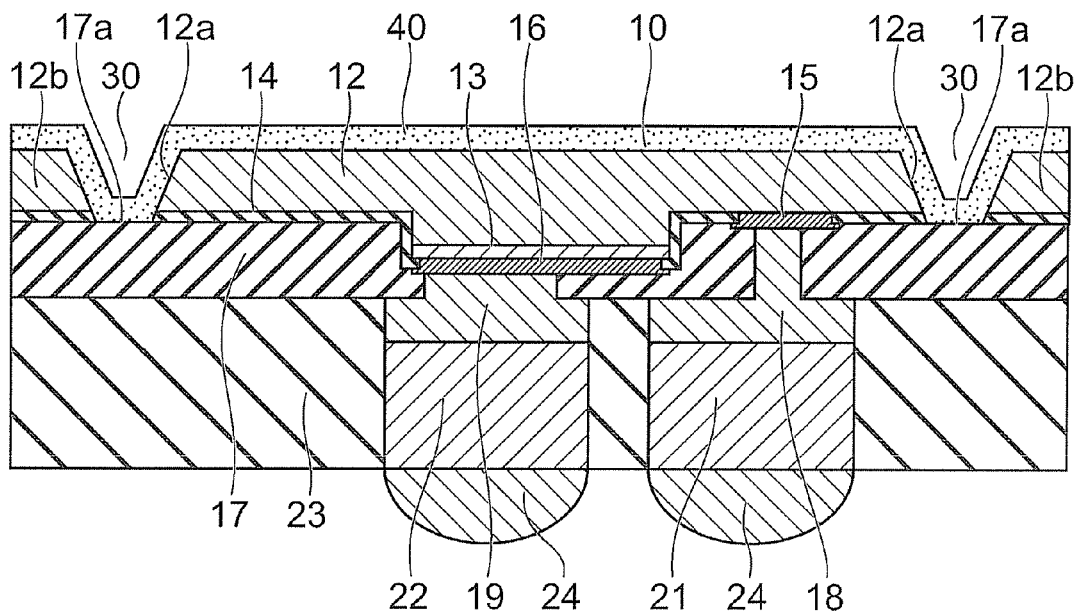
FIGS. 6A and 6B are schematic views of a semiconductor light-emitting device according to another embodiment.
Figure 6B:
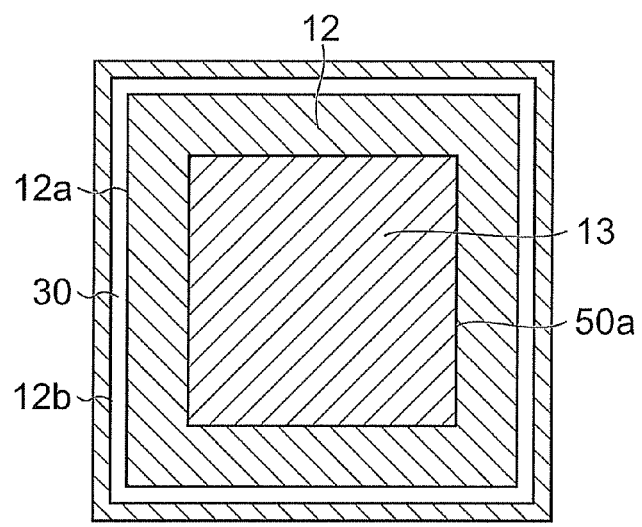
Figure 8B:
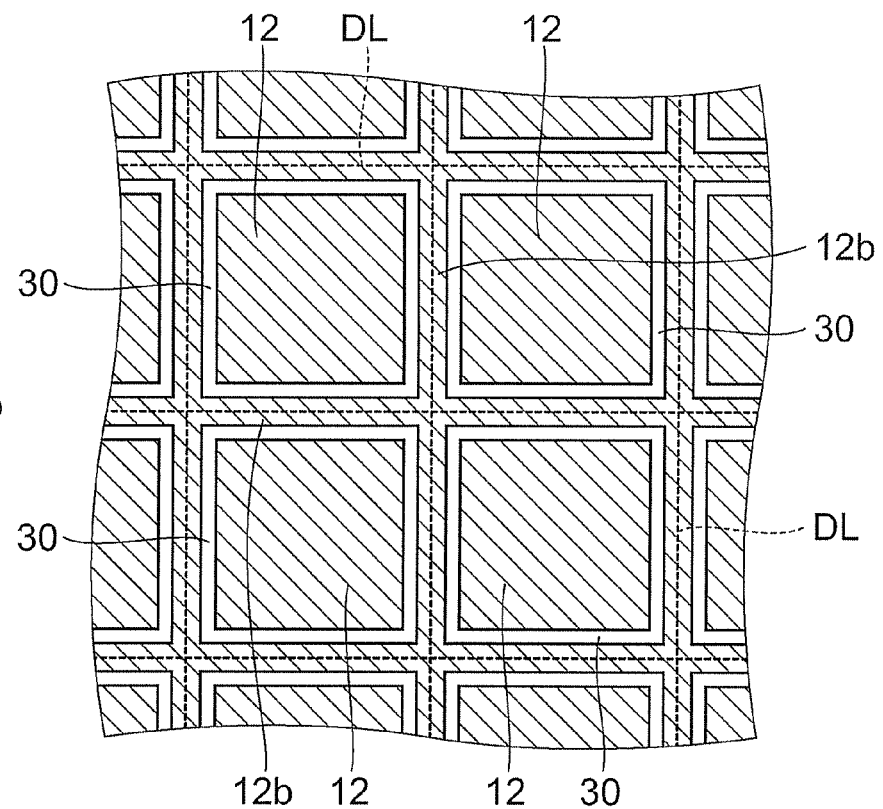

The dicing position is not limited to the position of the groove 30. FIG. 6A shows a semiconductor light-emitting device according to another embodiment which is singulated by dicing at a position outside the groove 30. FIG. 6B shows a planar layout of its major components. FIG. 8B shows a planar layout of the major components in the wafer state before dicing.

The first semiconductor layer 12 is divided by the groove 30 into a light-emitting section and a non-light-emitting section 12b. The light-emitting section includes the multilayer structure (protrusion) with the second semiconductor layer 13, and the portions where the electrodes 15, 16 are formed. The non-light-emitting section 12b does not include the light-emitting layer, and is not connected to the electrodes 15, 16, thus not emitting light.

The groove 30 continuously surrounds the periphery of the side surface 12a of the light-emitting section of the first semiconductor layer 12, and the non-light-emitting section 12b surrounds the groove 30. Also in this embodiment, the phosphor layer 40 is formed on the top surface 10 and in the groove 30 in the wafer state, and subsequently the device is diced at the position of the non-light-emitting section 12b of the first semiconductor layer 12. In FIG. 8B, the dicing line DL is shown by dashed lines.

According to this embodiment, at the time of dicing, it is possible to reliably avoid damage to the side surface 12a of the light-emitting section of the first semiconductor layer 12 and the phosphor layer 40 covering the side surface 12a.

It is noted that dicing at the position of the groove 30 can reduce ineffective area making no contribution to light emission and can decrease the planar size of the singulated device.

Figure 7:
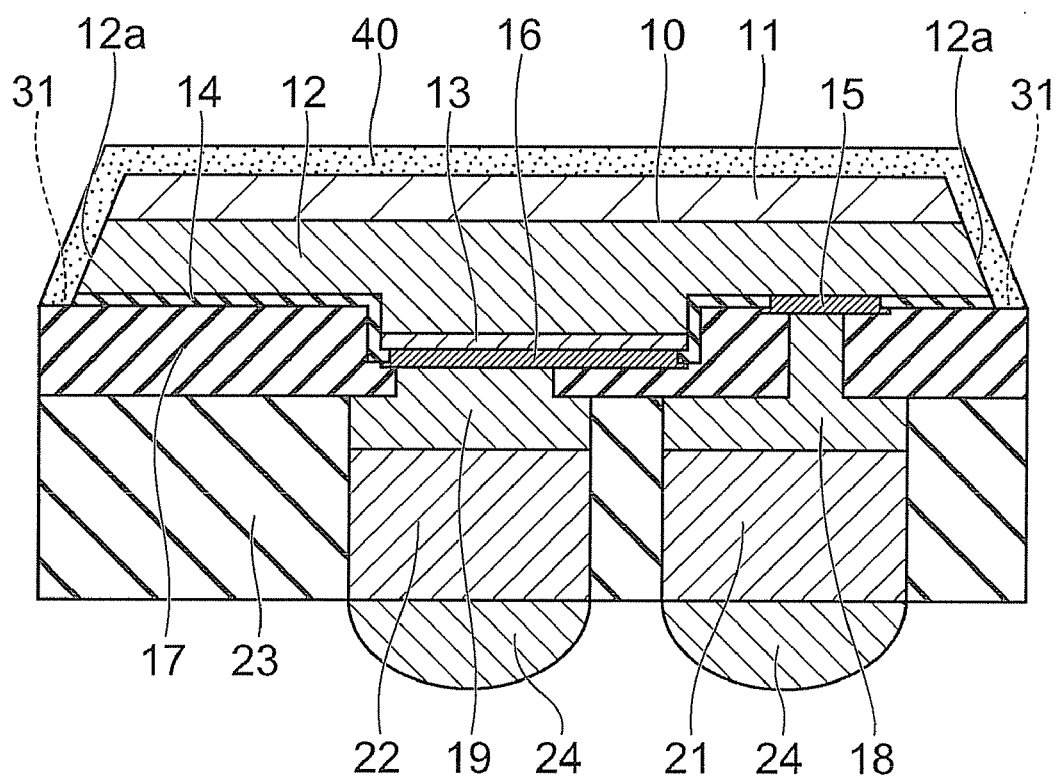
FIG. 7 is a schematic cross-sectional view of a semiconductor light-emitting device according to still another embodiment.

On the other hand, the substrate 11 may not be completely removed, but ground thinly and left on the top surface 10 as shown in FIG. 7. By thinning and leaving the substrate 11, it is possible to achieve higher mechanical strength, and hence a more reliable structure, than the structure in which the substrate 11 is completely removed. Furthermore, the remaining substrate 11 can prevent warpage after singulation, which facilitates mounting on a circuit board and the like.

The embodiments of the invention have been described with reference to examples. However, the invention is not limited thereto, but can be variously modified within the spirit of the invention. The material, size, shape, layout and the like of the substrate, semiconductor layer, electrode, interconnect layer, metal pillar, insulating film, insulating layer, and resin can be variously modified by those skilled in the art, and such modifications are also encompassed within the scope of the invention as long as they do not depart from the spirit of the invention.

The invention claimed is:

1. A semiconductor light-emitting device comprising:
    a first semiconductor layer having a first major surface, a second major surface which is an opposite side from the first major surface, and a side surface;
    a second semiconductor layer provided on a top of the second major surface of the first semiconductor layer and including a light-emitting layer;
    electrodes provided on the second major surface of the first semiconductor layer and on a lower surface of the second semiconductor layer on an opposite side from the first semiconductor layer;
    an insulating layer having a first surface above the lower surface of the second semiconductor layer and a second surface which is an opposite side from the first surface;
    an external terminal which is a conductor provided on the second surface side of the insulating layer; and
    a phosphor layer provided on the first major surface of the first semiconductor layer and on the side surface of the first semiconductor layer on the first surface of the insulating layer;
    wherein a portion of the first semiconductor layer is formed above the first surface of the insulating layer and another portion of the first semiconductor layer is formed below the first surface of the insulating layer.

2. The device of claim 1, wherein the phosphor layer covers a step portion between the first surface of the insulating layer and the first major surface of the first semiconductor layer.

3. The device of claim 2, wherein the first semiconductor layer is larger in planar size than the second semiconductor layer, and the step portion is formed at a portion of the first semiconductor layer outside an outer edge of the second semiconductor layer.

4. The device of claim 1, wherein the phosphor layer is provided in a groove reaching the first surface of the insulating layer through the first semiconductor layer.

5. The device of claim 4, wherein the first semiconductor layer is larger in planar size than the second semiconductor layer, and the groove is formed at a portion of the first semiconductor layer outside an outer edge of the second semiconductor layer.

6. The device of claim 1, wherein the phosphor layer continuously surrounds a periphery of the side surface of the first semiconductor layer.

7. The device of claim 1, wherein a distance between the side surface and an edge of an interface between the first semiconductor layer and the second semiconductor layer is generally uniform throughout the periphery of the first semiconductor layer.

8. The device of claim 1, wherein the phosphor layer is provided in contact with the first major surface of the first semiconductor layer.

9. The device of claim 1, further comprising: a metal pillar connected to each of the electrodes and provided on the second major surface side, wherein the external terminal is provided on an end surface of the metal pillar on an opposite side from each of the electrodes.

10. The device of claim 9, further comprising: a resin covering a periphery of the metal pillar.

11. A semiconductor light-emitting device comprising:
a first semiconductor layer having a first major surface, a second major surface which is an opposite side from the first major surface, and a side surface;
a second semiconductor layer provided on a top of the second major surface of the first semiconductor layer and including a light-emitting layer;
electrodes provided on the second major surface of the first semiconductor layer and on a lower surface of the second semiconductor layer on an opposite side from the first semiconductor layer;
an insulating layer having a first surface above the lower surface of the second semiconductor layer and a second surface which is an opposite side from the first surface; and
a phosphor layer provided on the first major surface of the first semiconductor layer and on the side surface of the first semiconductor layer in a groove on the first surface of the insulating layer;
wherein a portion of the first semiconductor layer is formed above the first surface of the insulating layer and another portion of the first semiconductor layer is formed below the first surface of the insulating layer.

12. The device of claim 11, wherein the groove continuously surrounds a periphery of the side surface of the first semiconductor layer.

13. The device of claim 11, wherein a distance between the side surface and an edge of an interface between the first semiconductor layer and the second semiconductor layer is generally uniform throughout the periphery of the first semiconductor layer.

14. The device of claim 12, wherein the groove divides the first semiconductor layer into a light-emitting section including a multilayer structure with the second semiconductor layer and a non-light-emitting section outside the side surface.

15. The device of claim 11, wherein the phosphor layer is provided in contact with the first major surface of the first semiconductor layer.

16. The device of claim 11, further comprising: a metal pillar connected to each of the electrodes and provided on the second major surface side.

17. The device of claim 1, wherein the phosphor layer is also provided on the side surface of the first semiconductor layer and on the portion of the first surface of the insulating layer.

18. The device of claim 11, wherein the phosphor layer is also provided on the side surface of the first semiconductor layer and on the portion of the first surface of the insulating layer.

19. The device of claim 1, wherein the first semiconductor layer is provided in a mesa or trapezoidal shape on the first surface of the insulating layer.

20. The device of claim 11, wherein the first semiconductor layer is provided in a mesa or trapezoidal shape on the first surface of the insulating layer.

* * * * *